United States Patent
Odnoblyudov (10) Patent No.: US 10,711,957 B2
(45) Date of Patent: *Jul. 14, 2020

(54) LINEAR LED MODULE

(71) Applicant: BRIDGELUX, INC., Fremont, CA (US)

(72) Inventor: Vladimir Odnoblyudov, Danville, CA (US)

(73) Assignee: BRIDGELUX INC., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/208,146

(22) Filed: Dec. 3, 2018

(65) Prior Publication Data

US 2019/0249835 A1 Aug. 15, 2019

Related U.S. Application Data

(63) Continuation of application No. 15/846,076, filed on Dec. 18, 2017, now Pat. No. 10,145,522, which is a continuation of application No. 15/063,263, filed on Mar. 7, 2016, now Pat. No. 9,845,926, which is a continuation of application No. 14/450,111, filed on Aug. 1, 2014, now Pat. No. 9,310,045.

(51) Int. Cl.
| | | |
|---|---|---|
| F21S 4/24 | (2016.01) | |
| F21V 3/04 | (2018.01) | |
| F21V 23/00 | (2015.01) | |
| F21V 7/22 | (2018.01) | |
| F21S 8/04 | (2006.01) | |
| F21V 7/05 | (2006.01) | |
| F21V 23/06 | (2006.01) | |
| F21Y 103/10 | (2016.01) | |
| F21Y 115/10 | (2016.01) | |

(52) U.S. Cl.
CPC . *F21S 4/24* (2016.01); *F21S 8/04* (2013.01); *F21V 3/049* (2013.01); *F21V 7/05* (2013.01); *F21V 7/22* (2013.01); *F21V 23/005* (2013.01); *F21V 23/06* (2013.01); *F21Y 2103/10* (2016.08); *F21Y 2115/10* (2016.08); *H01L 2224/14* (2013.01); *H01L 2224/16225* (2013.01)

(58) Field of Classification Search
CPC .... F21S 4/24; F21S 8/04; F21V 23/06; F21V 23/005; F21V 7/05; F21V 7/22; F21V 3/049; H04L 2224/14; F21Y 2115/10; F21Y 2103/10

See application file for complete search history.

(56) References Cited

U.S. PATENT DOCUMENTS

| | | |
|---|---|---|
| 6,361,186 B1 | 3/2002 | Slayden |
| 7,506,997 B1 | 3/2009 | Eriksson |
| 8,177,391 B2 | 5/2012 | Ryu et al. |
| 8,556,453 B1 | 10/2013 | Crane et al. |

(Continued)

*Primary Examiner* — Joseph L Williams
*Assistant Examiner* — Jose M Diaz
(74) *Attorney, Agent, or Firm* — Arent Fox LLP (57) ABSTRACT

Various aspects of a light emitting apparatus include a substrate having at least one angled portion. Some aspects of the light emitting apparatus include at least one light emitting device arranged on the substrate. Some aspects of the light emitting apparatus include a plurality of conductors arranged on the substrate. In some aspects of the light emitting apparatus, the conductors are electrically coupled to the at least one light emitting device.

24 Claims, 4 Drawing Sheets (56) References Cited

U.S. PATENT DOCUMENTS

| | | |
|---|---|---|
| 2003/0025457 A1 | 2/2003 | Tai |
| 2009/0261368 A1 | 10/2009 | Wang et al. |
| 2009/0267104 A1 | 10/2009 | Hsu et al. |
| 2009/0323334 A1 | 12/2009 | Roberts et al. |
| 2010/0142215 A1 | 6/2010 | Waring |
| 2012/0057336 A1 | 3/2012 | Farmer |
| 2012/0162978 A1 | 6/2012 | Farmer |
| 2013/0039050 A1 | 2/2013 | Dau et al. |
| 2013/0242550 A1 | 9/2013 | Suen et al. |
| 2013/0265751 A1 | 10/2013 | Edmond et al. |
| 2014/0104818 A1 | 4/2014 | Khojasteh et al. |
| 2014/0111982 A1 | 4/2014 | Kuenzler |
| 2014/0167598 A1 | 6/2014 | Chen et al. |
| 2014/0168961 A1 | 6/2014 | Dubord |
| 2014/0225152 A1 | 8/2014 | Asahi et al. |
| 2015/0003065 A1 | 1/2015 | Chen et al. |
| 2015/0016108 A1 | 1/2015 | Howe |
| 2015/0097277 A1 | 4/2015 | Chen et al. |
| 2015/0200230 A1 | 7/2015 | Jang et al. |
| 2016/0172558 A1* | 6/2016 | Liu ...................... H01L 33/382 257/98 |
| 2016/0252219 A1 | 9/2016 | Hikmet et al. |

\* cited by examiner

LINEAR LED MODULE

CROSS-REFERENCE TO RELATED APPLICATIONS

This application is a continuation of U.S. patent application Ser. No. 15/846,076, filed Dec. 18, 2017, now U.S. Pat. No. 10,145,522, which is a is a continuation of U.S. patent application Ser. No. 15/063,263, filed Mar. 7, 2016, now U.S. Pat. No. 9,845,926, which is a is a continuation of U.S. patent application Ser. No. 14/450,111, filed Aug. 1, 2014, now U.S. Pat. No. 9,310,045, the disclosures of each of which are hereby incorporated by reference in their entireties.

BACKGROUND

Field

The present disclosure relates generally to a linear LED module and, more particularly, to a linear LED module that uses a flexible substrate with angled portions.

Background

Solid state light emitting devices, such as light emitting diodes (LEDs), are attractive candidates for replacing conventional light sources such as incandescent, halogen, and fluorescent lamps. LEDs have substantially longer lifetimes than all three of these types of conventional light sources. In addition, some types of LEDs now have higher conversion efficiencies than fluorescent light sources and still higher conversion efficiencies have been demonstrated in laboratories. Finally, LEDs contain no mercury or other potentially dangerous materials, therefore, providing various safety and environmental benefits.

A troffer is a light fixture resembling an inverted trough that is either recessed in, or suspended from, the ceiling. Troffers are typically designed to emit light using fluorescent lighting tubes. The fluorescent tubes emit light along the entire length of the troffer to produce a focused light distribution pattern. However, fluorescent lighting tubes may be expensive, require a warm up period, and produce flicker that is undesirable.

More recently, solid state light emitting devices have been used to replace fluorescent lamps conventionally used in troffer assemblies. LEDs are attractive candidates for replacing fluorescent lighting tubes because LEDs have no warm up time, are long lasting and power efficient, and do not flicker. Troffer assemblies with LED light sources are sometimes referred to as linear LED modules, and conventional linear LED modules have been widely utilized in the global troffer market.

Typically, conventional linear LED designs utilize rigid FR4 or Metal Core Printed Circuit Board (MCPCB) substrates coated with a white solder mask for light reflection and diffusion. Such boards are commonly mounted on rigid metal plates (such as aluminum) with reflective sides for directing light down into a diffuser lens and out of the metal troffer tube. The metal plate sometimes also doubles as a heat sink.

The conventional linear LED assembly can be expensive, heavy, and overly complex. It is therefore difficult to design a linear LED assembly that is both cost efficient, lightweight, and is not overly complex.

SUMMARY

Several aspects of the present invention will be described more fully hereinafter with reference to various apparatuses.

One aspect of a light emitting apparatus includes a substrate having at least one angled portion. The light emitting apparatus includes at least one light emitting device arranged on the substrate. The light emitting apparatus includes a plurality of conductors arranged on the substrate. The conductors are electrically coupled to the at least one light emitting device.

Another aspect of the light emitting apparatus includes at least one light emitting device. The light emitting apparatus includes a flexible substrate having a member supporting the at least one light emitting device. The light emitting apparatus includes an angled portion extending from the member.

An aspect of a lamp includes a housing. The lamp includes a light emitting apparatus coupled to the housing. The light emitting apparatus includes at least one light emitting device. The light emitting apparatus includes a flexible substrate carried by the housing. The flexible substrate includes a reflective portion and a diffusive portion, wherein the at least one light emitting device is arranged on the diffusive portion.

BRIEF DESCRIPTION OF THE DRAWINGS

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, bulb shapes, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

Various aspects of apparatuses will now be presented in the detailed description by way of example, and not by way of limitation, with reference to the accompanying drawings, wherein:

FIG. 4b illustrates a cross-section view of an exemplary embodiment of a light emitting apparatus having the flexible substrate of FIG. 4a.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation.

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method. Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "beneath" or "bottom" and "above" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being "above" other elements would then be oriented "below" other elements and vice versa. The term "above", can therefore, encompass both an orientation of "above" and "below," depending of the particular orientation of the apparatus. Similarly, if an apparatus in the drawing is turned over, elements described as "below" other elements would then be oriented "above" the other elements. The terms "below" can, therefore, encompass both an orientation of above and below.

It will be further understood that the terms "comprises" and/or "comprising," when used in this specification, specify the presence of stated features, steps, operations, elements, and/or components, but do not preclude the presence or addition of one or more other features, integers, steps, operations, elements, components, and/or groups thereof. The term "and/or" includes any and all combinations of one or more of the associated listed items.

Unless otherwise defined, all terms (including technical and scientific terms) used herein have the same meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In the following detailed description, various aspects of the present invention will be presented in the context of a light-emitting device. A light-emitting die shall be construed broadly to include any suitable solid state light source such as, by way of example, a light emitting diode (LED) or other solid state material which releases photons or light through the recombination of electrons and holes flowing across a p-n junction. Accordingly, any reference to an LED or light throughout this disclosure is intended only to illustrate the various aspects of the present invention, with the understanding that such aspects may have a wide range of applications.

Figure 1:
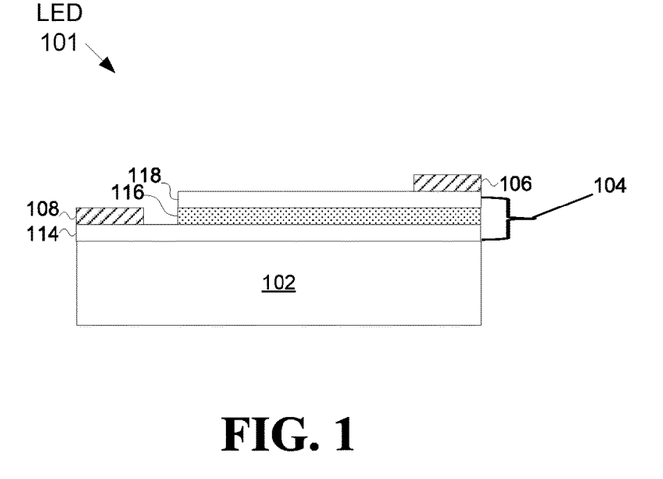
FIG. 1 illustrates an exemplary embodiment of an LED

The following description describes a linear LED module that is designed to minimize cost while providing the same efficacy as conventional linear LED modules. The linear LED module utilizes a flexible substrate, which will be described in greater detail below. The flexible substrate minimizes the complexity associated with designing linear LED modules for troffer devices by providing bendable portions which can be adjusted to fit most designs. Moreover, the flexible substrate negates the need for a rigid substrate coupled to a heavy reflector. The flexible substrate is capable of providing the same directed light effect of both the rigid substrate and attached reflector, but at a lower cost. As will be discussed in greater detail below, several LEDs having different designs may be arranged on the flexible substrate. FIG. 1 is an example of one such LED design.

FIG. 1 illustrates an exemplary embodiment of an LED 101. An LED is a semiconductor material impregnated, or doped, with impurities. These impurities add "electrons" or "holes" to the semiconductor, which can move in the material relatively freely. Depending on the kind of impurity, a doped region of the semiconductor can have predominantly electrons or holes, and is referred respectively as n-type or p-type semiconductor regions.

Referring to FIG. 1, the LED 101 includes an n-type semiconductor region 114 and a p-type semiconductor region 118. A reverse electric field is created at the junction between the two regions, which cause the electrons and holes to move away from the junction to form an active region 116. When a forward voltage sufficient to overcome the reverse electric field is applied across the p-n junction through a pair of electrodes 108, 106, electrons and holes are forced into the active region 116 and recombine. When electrons recombine with holes, they fall to lower energy levels and release energy in the form of light.

In this example, the n-type semiconductor region 114 is formed on a substrate 102 and the p-type semiconductor region 118 is formed on the active layer 116, however, the regions may be reversed. That is, the p-type semiconductor region 118 may be formed on the substrate 102 and the n-type semiconductor region 114 may formed on the active layer 116. As those skilled in the art will readily appreciate, the various concepts described throughout this disclosure may be extended to any suitable layered structure. Additional layers or regions (not shown) may also be included in the LED 101, including but not limited to buffer, nucleation, contact and current spreading layers or regions, as well as light extraction layers.

The p-type semiconductor region 118 is exposed at the top surface, and therefore, the p-type electrode 106 may be readily formed thereon. However, the n-type semiconductor region 114 is buried beneath the p-type semiconductor layer 118 and the active layer 116. Accordingly, to form the n-type electrode 108 on the n-type semiconductor region 114, a cutout area or "mesa" is formed by removing a portion of the active layer 116 and the p-type semiconductor region 118 by means well known in the art to expose the n-type semiconductor layer 114 there beneath. After this portion is removed, the n-type electrode 108 may be formed.

Figure 2:
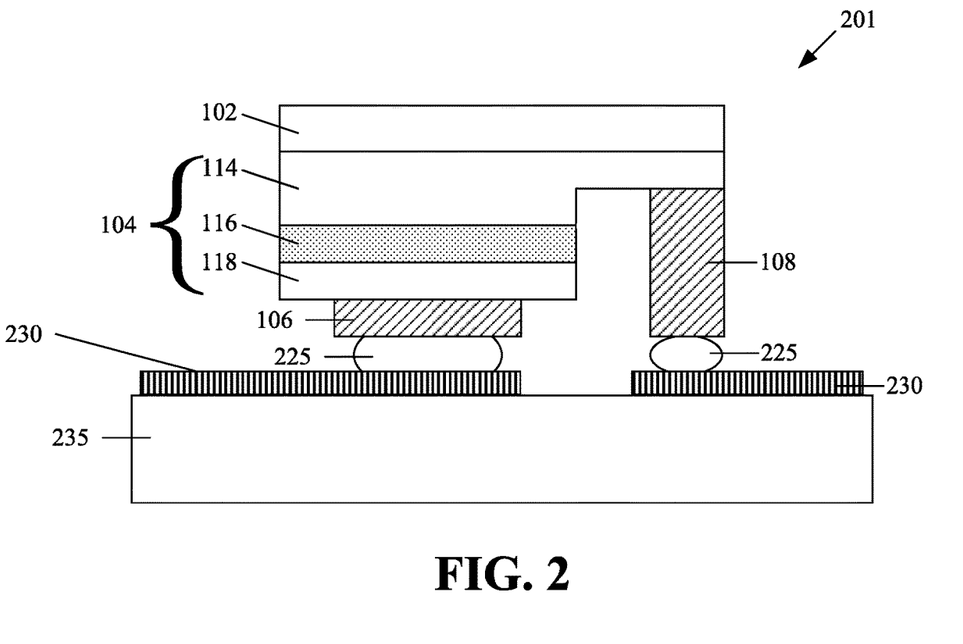
FIG. 2 illustrates an exemplary embodiment of an LED chip having a flip-chip architecture.

FIG. 2 illustrates an exemplary embodiment of an LED chip having a flip-chip architecture. Flip-chip LED 201 includes similar features of the LED illustrated in FIG. 1. However, the features are flipped over. For instance, electrodes 106 and 108 are positioned beneath p-type semiconductor region 118 and n-type semiconductor region 114 rather than above the p-type semiconductor region 118 and n-type semiconductor region 114 as shown in FIG. 1. As a result solders 225 couple the flip-chip LED 201 to conductive layer 230. The conductive layer is arranged over substrate 235. As will be discussed in greater detail in the following sections, the substrate 235 may be a flexible substrate capable of being bent into different configurations.

Figure 3A:
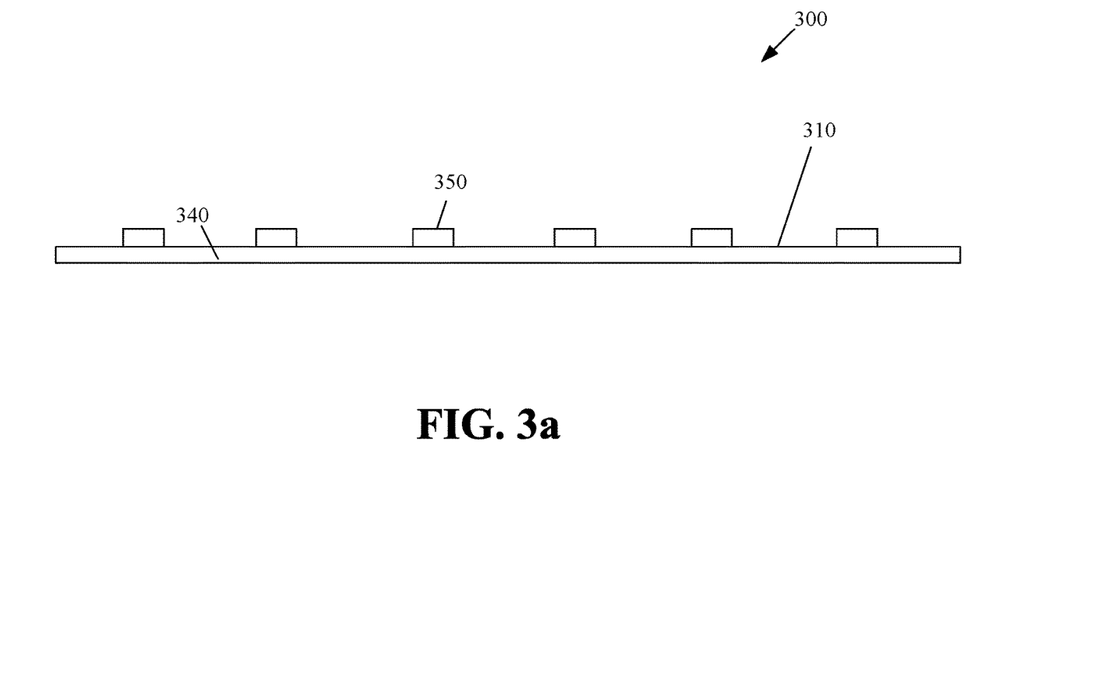
FIG. 3a illustrates a plan view of an exemplary embodiment of a light emitting apparatus having several LEDs arranged on a flexible substrate.

FIG. 3a illustrates a plan view of an exemplary embodiment of a light emitting apparatus 300 having several LEDs 350 arranged on a flexible substrate 340. An example of a flexible substrate 340 is an Al substrate having a thickness between 0.1 mm and 0.5 mm. Alternatively, the substrate 340 may be a multi-layer structure having a similar thickness between 0.1 mm and 0.5 mm. The multi-layer structure may be formed with two Al layers separated by a dielectric layer, Al and Cu layers separated by a dielectric layer, two Cu layers separated by a dielectric layer, or some other suitable layered structure. Those skilled in the art will be readily able to determine the appropriate material and thickness of the material to produce a flexible substrate suitable for any particular application.

The plan view includes LEDs 350, flexible substrate 340 and a top surface of the flexible substrate 310. The LEDs 350, in some aspects of the apparatus, may be lateral LEDs such as the LED architecture described with respect to FIG. 1 or flip-chip LEDs such as the LED architecture described with respect to FIG. 2. The flexible substrate 340 of some aspects of the apparatus may be manufactured using a reel-to-reel process. The reel-to-reel process involves creating an electronic device (or substrate) on a roll of flexible plastic or metal foil. LEDs are then mounted to the substrate. In the example shown in FIG. 3a, the substrate 340 may be an aluminum substrate manufactured using the reel-to-reel process.

As will be shown in greater detail in the following drawings, the LED 350 may be a chip on board package that is mounted directly to the substrate 340. In addition, the LEDs 350 may be lateral LEDs or flip-chip LEDs. The substrate 340 may also include conductors 310 to interconnect the LEDs 350. An insulation layer (not shown) may be formed between the substrate 334 and the conductors 310 to electrically insulate the two.

In one embodiment, the top surface of the substrate 340 may include a reflective layer (not shown). An insulation layer (not shown) may be formed between the reflective layer and the conductors 310 with vias to provide electrical connections between the conductors 310 and the LEDs 350. In an alternative embodiment, the reflective layer may be an insulator, thereby eliminating the need for a separate insulation layer between the reflective layer and the conductors 310. By way of example, the reflective layer may be a white solder mask such as those manufactured by Taiyo America or other manufacturers.

The substrate 340 provides a thinner lightweight substrate for linear LEDs, which is more customizable and cost efficient. The substrate 340 replaces the need for a heavy reflector and rigid substrate combination. Thus, the flexible substrate provides a less complex design that produces the same directed lighting effect.

Figure 3B:
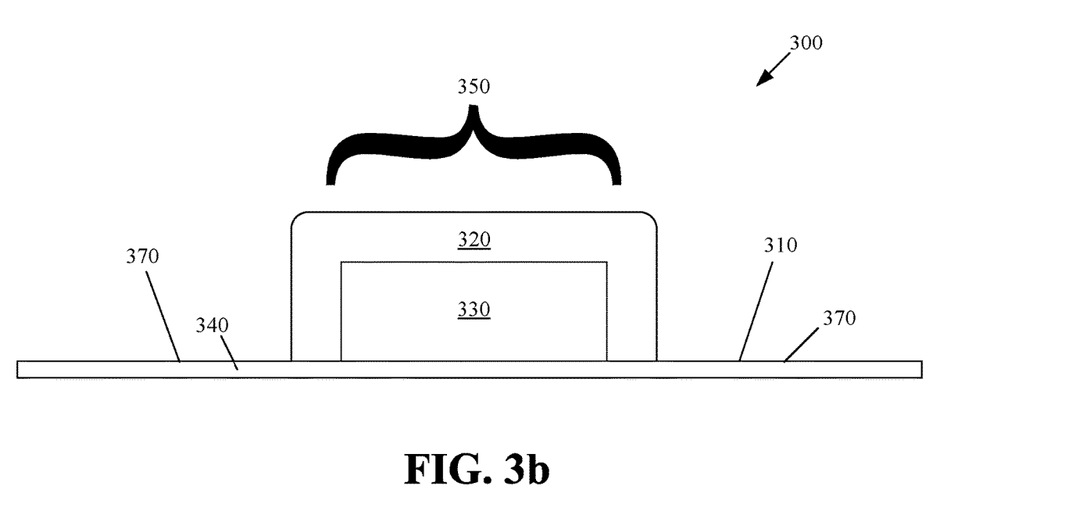
FIG. 3b illustrates a cross-section view of an exemplary embodiment of a light emitting apparatus having an encapsulated LED arranged on a flexible substrate.

FIG. 3b illustrates a cross-section view of an exemplary embodiment of a light emitting apparatus 300 having an encapsulated LED arranged on a flexible substrate. In some aspects of the apparatus, FIG. 3b is a cross-sectional view of the light emitting apparatus illustrated in FIG. 3a. Similar to FIG. 3a, the cross-sectional view includes the LED 350, the flexible substrate 340, and the top surface of the flexible substrate 310. The cross-sectional view additionally includes bending points 370. The LED 350 includes a flip-chip LED 330 and an encapsulant 320, forming a chip-on-board package. In some aspects of the apparatus, a phosphor may also be disposed over LED 330 and the encapsulant may be a lens. Although this exemplary view includes a flip-chip LED 330, any suitable LED design could be mounted on the substrate 340. Furthermore, the design illustrated in FIGS. 3a and 3b is not only limited to chip-on-board packages.

The flexible substrate 340 is configured to bend at bending points 370. The ability to bend the flexible substrate 340 at the bending points 370 replaces the need for a reflector in addition to the rigid substrate used in conventional linear LED modules. Additionally, the angle of the bend can be customized, making the same flexible substrate 340 capable of accommodating different troffer designs. By bending the flexible substrate 340, the light emitting apparatus may be capable of focusing light in a downward direction to a diffusive lens, which is typically used in troffer assemblies.

Figure 4A:
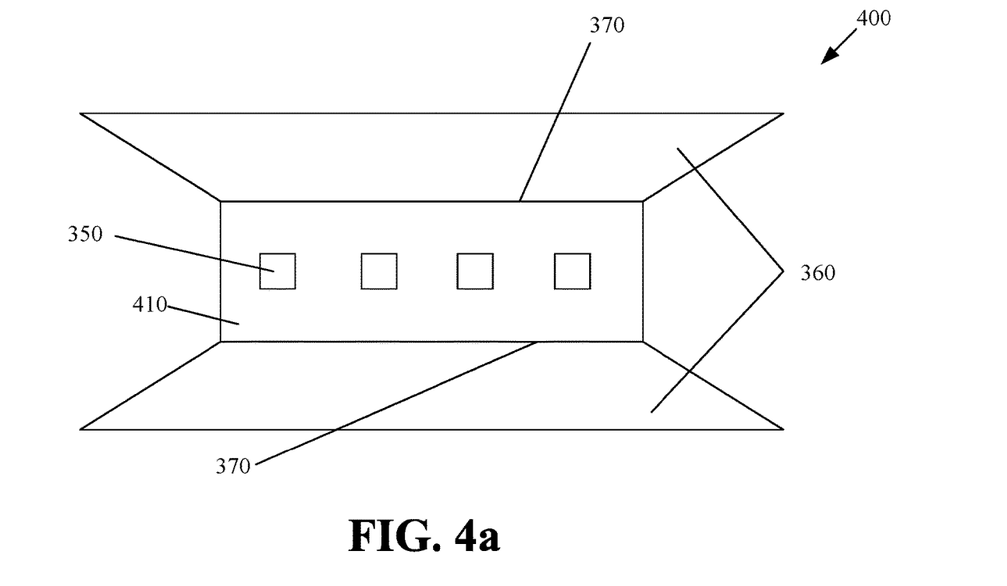
FIG. 4a illustrates a top view of an exemplary embodiment of a light emitting apparatus having several LEDs arranged on a flexible substrate.

FIG. 4a illustrates a top view of an exemplary embodiment of a light emitting apparatus 400 having several LEDs arranged on a flexible substrate. FIG. 4a includes similar features to those already discussed with respect to FIGS. 3a and 3b. However, FIG. 4a differs from FIGS. 3a and 3b in that it includes angled portions 360 that have been bent up at bending points 370.

As discussed above portions of the substrate 340 may include reflective surfaces. In this example, angled portions 360 may include the reflective portions of the substrate. The top portion 410 of the substrate that is between the bending points 370 may include the diffusive layer. However, as discussed above, the angled portions 360 and horizontal surface 410 may have a diffusive material layered above the surface such as a white solder mask. In some aspects of the apparatus, the diffusive material may be printed around the LEDs 350 on the horizontal surface 410. The angled portions 360 may have a reflective material layered above the diffusive material. Conversely, the angled portions 360 may have exposed aluminum. Thus, the reflective surfaces of the flexible substrate provide the same effect as the rigid metal reflector plate used in conventional linear LED modules. Additionally, a conductive layer may be arranged over the surface 410 depending on the type of LED utilized for the design.

Figure 4B:
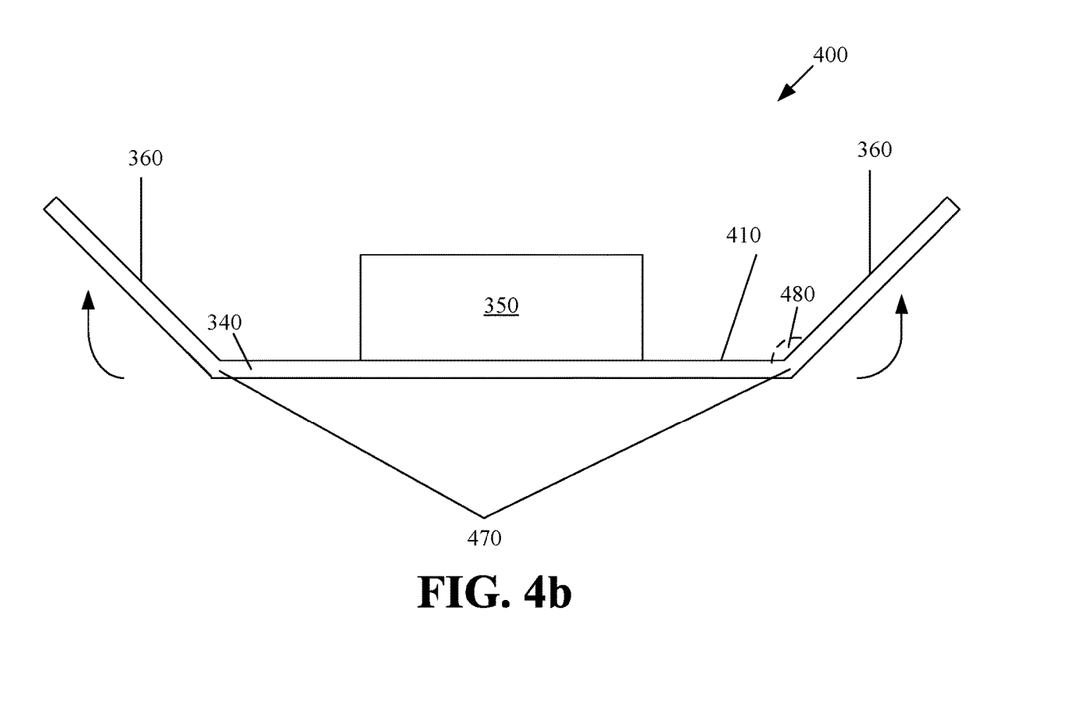

FIG. 4b illustrates a cross-section view of an exemplary embodiment of a light emitting apparatus having the flexible substrate of FIG. 4a. As illustrated in more detail, the bent portions 360 of the flexible substrate are bent up at bending points 470. The angled portions 360 are bent at a particular angle 480. The particular angle 480 may be a predetermined angle based on specifications of a lighting module that will use the flexible substrate. Preferably, the angle 480 may be between 30° and 60°, bit other angle may be used depending on the particular application. Thus, the exemplary design illustrated in FIG. 4b provides the same effect as conventional linear LED modules, but uses a less costly and less complex design.

In some aspects of the apparatus, the flexible substrate 340 may be mounted on an inexpensive linear plastic object. Additionally, the angle may be adjusted to suit different troffer designs, while still providing the requisite focusing effect on the emitted light.

Figure 5:
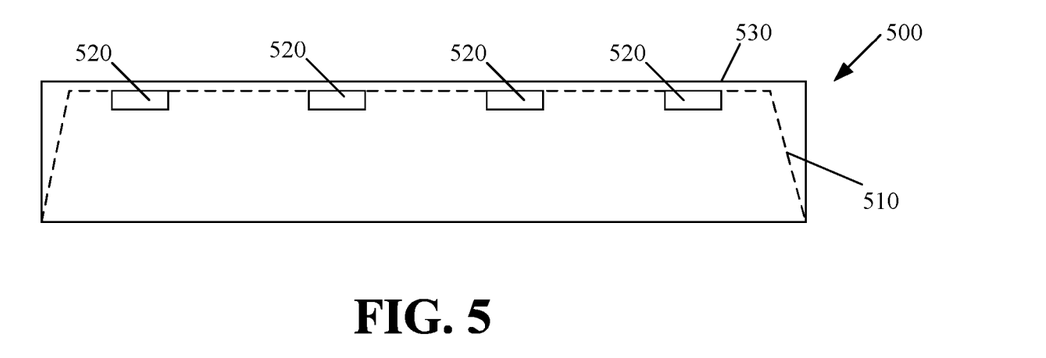
FIG. 5 illustrates a cross-section view of a troffer device of an exemplary embodiment of the light emitting device having a flexible substrate.

FIG. 5 illustrates a cross-section view of a troffer device 500 of an exemplary embodiment of the light emitting device having a flexible substrate. The illustrated troffer device 500 may be suitable for use an as internal lighting device, such as a ceiling light. The troffer device 500 includes a housing 530. In some aspects of the light emitting device, the housing 540 may be a housing that is typically used for fluorescent lighting. The housing 540 includes a flexible substrate 510 and several LEDs 520. As shown, the LEDs 520 are arranged on the flexible substrate 510. The flexible substrate and light distribution pattern emitted from the troffer device 500 will be discussed in greater detail with respect to FIGS. 6 and 7.

Figure 6:
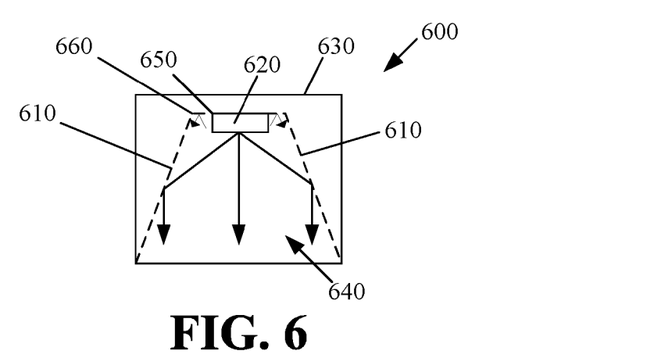
FIG. 6 illustrates a side view of a troffer device of an exemplary embodiment of the light emitting device.

FIG. 6 illustrates a side view of a troffer device 600 of an exemplary embodiment of the light emitting device. The side view illustrated in FIG. 6 may be a side view of the troffer device 500 described with respect to FIG. 5. As shown, the troffer device 600 includes a housing 630, a reflective surface 610 of the flexible substrate, a diffusive surface 650 of the flexible substrate, and a bending point 660. FIG. 6 also illustrates a light distribution pattern 640.

As shown, the LED 620 is arranged on the diffusive surface 650. In some aspects of the light emitting device, the diffusive surface 650 covers a portion of the flexible substrate around the LED 620 and between angled portions of the flexible substrate. The angled portion of the flexible substrate may include the reflective surface 610. As shown, the flexible substrate is bent at bending point 660 to fit the housing 630. The flexible substrate may be bent along any point to form various different angles and configurations. Thus, the flexible substrate may be configured to fit a variety of different sized troffer housings.

The troffer device 600 is configured to focus light in a downward direction as is shown by light distribution pattern 640. Specifically, the reflective portions 610 of the flexible substrate are angled such that light emitted from the LED 620 may reflect off of the reflective surface 610 to enhance the light distribution effects of the troffer device 600 by focusing the light downward. The light may be focused toward a diffusive lens positioned at the bottom of the troffer device, which produces a more uniform light distribution. Additionally, some of the light emitted from LED 620 may be diffused by the diffusive surface 650 further enhancing the lighting efficacy. The combination of the diffusive surface 650 and reflective surfaces 610 of the flexible substrate provides a downward focused light distribution pattern 640 similar to the light distribution pattern of conventional linear LED modules that use a substrate mounted on a reflector.

Figure 7:
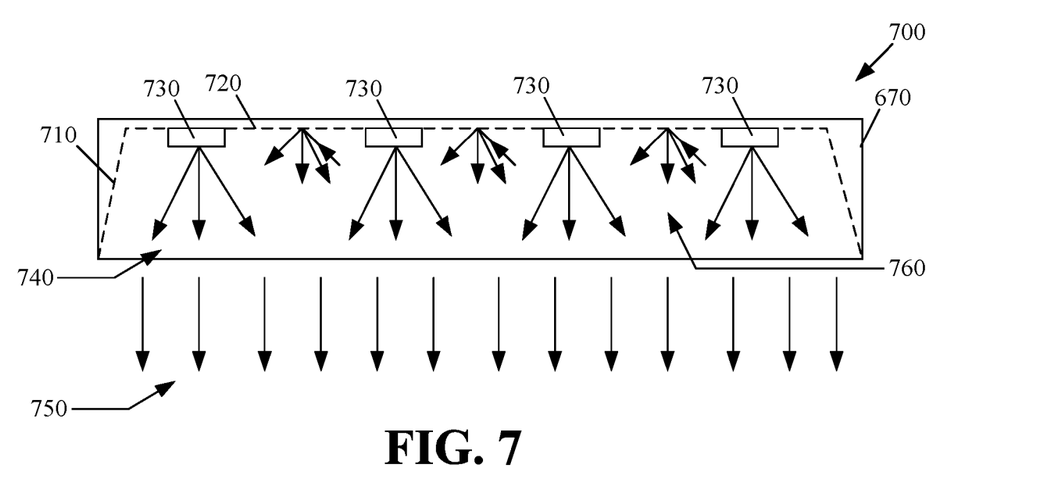
FIG. 7 illustrates a cross-section view of a troffer device that provides light distribution pattern.

FIG. 7 further illustrates a cross-section view of a troffer device 700 that provides light distribution pattern 750. FIG. 7 illustrates similar components to those described with respect to FIGS. 5 and 6. For instance, troffer device 700 includes a housing 670 similar to housing 530. The housing includes a flexible substrate 710 similar to the flexible substrate 510. The flexible substrate 510 includes a diffusive portion 720, which is similar to the diffusive portion 650. Additionally, the housing includes several LEDs 730, similar to the LED 620, arranged on the diffusive portion of the flexible substrate.

As shown, LEDs 730 may emit light 740, which is reflective off of the angled portions of the flexible substrate as described with respect to FIG. 6. Additionally, some of the emitted light 760 may be diffused by the diffusive portion 720 of the flexible substrate. The combination of the diffused and reflected light produces a focused light distribution pattern which may be diffused by a lens to produce the more desirable uniform lighting pattern 750. Thus, the flexible substrate arrangement a suitable replacement for the rigid reflector and substrate of conventional linear LED lighting systems because it produces the same lighting effect while using a simpler design.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A light emitting apparatus comprising:
   a substrate having a planar base and at least one side extending at an angle from the planar base;
   at least one light emitting device disposed on the substrate and within the at least one side of the substrate; and
   a diffusive surface disposed on at least the planar base of the substrate and around the at least one light emitting device,
   wherein the planar base of the substrate comprises a support member configured to support the at least one light emitting device, and wherein the at least one side is coupled to the support member at an obtuse angle between the support member and the at least one side.

2. The light emitting apparatus of claim 1, wherein the diffusive surface comprises a white portion disposed on the planar base of the substrate.

3. A light emitting apparatus of claim 2, comprising:
   a substrate having a planar base and at least one side extending at an angle from the planar base;
   at least one light emitting device disposed on the substrate and within the at least one side of the substrate; and
   a diffusive surface disposed on at least the planar base of the substrate and around the at least one light emitting device,
   wherein the diffusive surface comprises a white portion disposed on the planar base of the substrate, and
   wherein the white portion comprises a white solder mask arranged around the at least one light emitting device.

4. The light emitting apparatus of claim 1, wherein the at least one side comprises a reflective surface, wherein the at least one side has greater reflectivity than the support member.

5. The light emitting apparatus of 1, wherein the obtuse angle between the support member and the at least one side is configured to fit a troffer light fixture.

6. The light emitting apparatus of claim 1, wherein the at least one light emitting device comprises a flip chip LED.

7. The light emitting apparatus of claim 6, further comprising an encapsulant that encapsulates the flip chip LED.

8. The light emitting apparatus of claim 1, where the at least one light emitting device comprises a chip-on-board package.

9. A light emitting apparatus comprising:
   at least one light emitting device;
   a flexible substrate comprising:
      a support member configured to support the at least one light emitting device; and
      at least one side extending at an angle from the support member, wherein the at least one side comprises a diffusive surface of exposed aluminum.

10. The light emitting apparatus of claim 9, wherein the support member comprises the diffusive surface arranged around at least a portion of the at least one light emitting device.

11. The light emitting apparatus of claim 10, wherein the diffusive surface comprises a white solder mask.

12. The light emitting apparatus of claim 11, wherein the at least one side comprises a reflective surface, and wherein the at least one side has a greater reflectivity than the support member.

13. The light emitting apparatus of claim 9, wherein the angle between the support member and the at least one side is configured to fit a troffer light fixture.

14. The light emitting apparatus of claim 9, wherein the at least one light emitting device is a flip chip LED.

15. The light emitting apparatus of claim 14, further comprising an encapsulant that encapsulates the flip chip LED.

16. The light emitting apparatus of claim 9, wherein the at least one light emitting device comprises a chip-on-board package.

17. A troffer device comprising:
   a housing;
   a substrate coupled to the housing and having at least one side extending at an angle therefrom;
   at least one light emitting device disposed on the substrate and within the at least one side of the substrate; and
   a diffusive surface disposed on at least the planar base of the substrate and around the at least one light emitting device.

18. The troffer device of claim 17, wherein the substrate comprises a plurality of layers having at least one dielectric disposed therebetween, and wherein the plurality of layers comprise at least one of aluminum and copper.

19. The troffer device of claim 17, wherein the diffusive surface comprises a white portion disposed on the planar base of the substrate.

20. The troffer device of claim 17, further comprising an encapsulant disposed on a surface of the at least one light emitting device.

21. The troffer device of claim 17, wherein the angle of the at least one side is in a range of 30-60 degrees.

22. The troffer of claim 21, wherein the substrate is a flexible substrate, and wherein the angle is of the at least one side is based on a shape of the housing.

23. The troffer device of claim 17, further comprising a diffusive lens positioned at a bottom of the housing.

24. The troffer of claim 17, wherein the at least one side comprises a reflective surface, and wherein diffusive and reflective surfaces are collectively configured to focus light in a downward direction.

* * * * *